US006237054B1

(12) United States Patent
Freitag, Jr.

(10) Patent No.: US 6,237,054 B1
(45) Date of Patent: May 22, 2001

(54) NETWORK INTERFACE UNIT INCLUDING A MICROCONTROLLER HAVING MULTIPLE CONFIGURABLE LOGIC BLOCKS, WITH A TEST/PROGRAM BUS FOR PERFORMING A PLURALITY OF SELECTED FUNCTIONS

(75) Inventor: William W. Freitag, Jr., Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/152,748

(22) Filed: Sep. 14, 1998

(51) Int. Cl.$^7$ .............................. G06F 13/38; G06F 15/17
(52) U.S. Cl. ............................... 710/72; 370/395
(58) Field of Search ..................... 709/240, 238, 709/239, 249; 710/129; 340/825.79, 825.85, 825.89; 370/352, 353, 354, 395

(56) References Cited

U.S. PATENT DOCUMENTS

| | | | |
|---|---|---|---|
| 5,864,554 | * 1/1999 | Rostoker et al. | 370/395 |
| 5,943,481 | * 8/1999 | Wakeland | 709/230 |
| 5,950,012 | * 9/1999 | Shiell et al. | 395/712 |
| 6,012,099 | * 4/2000 | Chung | 709/249 |
| 6,070,003 | * 3/2000 | Gove et al. | 395/312 |

OTHER PUBLICATIONS

DeHon, "DPGA–Coupled Microprocessors: Commodity Ics for the Early 21$^{st}$ Century," Transit Note #100 from the M.I.T. Transit Project, originally issued Jan. 1994, downloaded and printed from the internet on Nov. 13, 1996, pp. 1–14.

* cited by examiner

Primary Examiner—Le Hien Luu
Assistant Examiner—Bunjob Jaroenchonwanit
(74) Attorney, Agent, or Firm—Kevin L. Daffer; Conley, Rose & Tayon (57) ABSTRACT

A network interface unit is presented including a microcontroller having multiple blocks of programmable logic that are variably configurable to perform selected functions. The network interface unit may be configured to assemble, transmit, and receive data units (i.e., frames) of one communication protocol, then later reconfigured to assemble, transmit, and receive frames of another protocol. The microcontroller includes several components formed upon a single monolithic semiconductor substrate, among them an execution unit. The execution unit includes a processor core and multiple configurable logic blocks (CLBs) coupled to the processor core. The processor core is configured to execute instructions, for example x86 instructions. Each of the multiple CLBs includes programmable logic which may be, for example, PLA circuitry, PAL circuitry, or FPGA circuitry. The programmable logic includes programmable switching elements such as, for example, EPROM elements, EEPROM elements, or SRAM elements. During instruction execution, the processor core produces output signals. During a programming operation, the output signals include programming signals which configure the programmable logic within one or more of the multiple CLBs to perform selected functions. Once programmed, each CLB performs the selected function in response to output signals produced by the processor core. The network interface unit also includes one or more memory devices and an electrical interface unit. The one or more memory devices store instructions and data used by the processor core. The electrical interface unit is adapted for coupling to the network transmission medium and performs as an interface between the microcontroller and the network transmission medium.

18 Claims, 8 Drawing Sheets

| Opening Flag Field | Address Field | Control Field | Information Field | Frame Check Sequencing Field | Closing Flag Field |
|---|---|---|---|---|---|
| 01111110 | 8 bits | 8 bits | 8*n bits | 16/32 bits | 01111110 |

Fig. 8

NETWORK INTERFACE UNIT INCLUDING A MICROCONTROLLER HAVING MULTIPLE CONFIGURABLE LOGIC BLOCKS, WITH A TEST/PROGRAM BUS FOR PERFORMING A PLURALITY OF SELECTED FUNCTIONS

BACKGROUND OF THE INVENTION

1. Field of the Invention

This invention relates to microcontrollers, and more particularly to microcontrollers employed within network interface units of devices coupled to computer networks. A microcontroller is presented having blocks of programmable logic that are variably configurable to handle different communication protocols.

2. Description of the Relevant Art

A computer network typically includes two or more computer systems interconnected for the purpose of exchanging data or sharing resources such as input/output (I/O) devices. There are two basic types of computer networks: local area networks (LANs) and wide area networks (WANs). A LAN is an interconnection of computer systems within a limited geographical area. A LAN may encompass a portion of a building, an entire building, or a cluster of buildings. A LAN allows users within the same office or company to exchange data files or share resources such as printers. A WAN connects computer systems over a large area, such as an entire city, state, or country. WANs are typically implemented using existing public switched telephone networks (PSTNs), and are thus operated and maintained by telephone service providers such as AT&T, MCI, and Sprint. A WAN allows users at remote sites, such as retail outlets, branch offices, or even their own homes, to exchange information with other users at a central corporate office or data site. The Internet, a complex interconnection of WANs, allows users to access information provided by companies and other users located worldwide.

Several different types of computer systems exist today, each manipulating and storing data in a different way. The interconnection of such diverse computer systems presents a challenging task. Networking capability is provided by hardware and/or software which implements a standardized interface specifically designed for the exchange of information among heterogeneous computer systems.

In an effort to allow different types of computer systems to communicate with one another, the international standards organization (ISO) developed an open systems interconnection (OSI) reference model. The OSI reference model defines various layers ranging from a lowermost physical layer (network cables and host adapter hardware) to an uppermost application layer (communication access software). Between the physical layer and application layer are various other layers used to implement a standard communication "protocol" used to transfer information between computer systems.

The OSI reference model provides for packet data transmission. In packet-switched networks, information is transferred between computer systems in small portions or "packets". The packets are transmitted sequentially over a transmission medium (e.g., coaxial cable, twisted-pair cable, or fiber-optic cable) interconnecting the network computer systems. Packet switching provides a way for all of the network computer systems to share the full data transmission capability of the transmission medium without interference or interminable waiting periods for access. As a result, packet-switched networks are common today. The OSI model includes a data link layer above the physical layer, and a network layer above the data link layer. The data link layer and the network layer, in combination, define the basic protocol used in the computer network. The network layer divides a block of data to be transmitted into packets. The data link layer is responsible for establishing a link between a transmitting computer system and a receiving computer system, encapsulating the packet data into "frames" which also include error control and flow control signals, transmitting the frames upon the network transmission medium, and deactivating the link when the data transfer is complete. Error control allows for detection of transmission errors. Flow control allows for transmission of data at a rate at which the receiving computer system can handle the incoming data.

A network interface unit within a computer system or other device performs the data-link-layer functions. In a transmit mode, the network interface unit of a transmitting device establishes a link with a network interface unit of a receiving device, encapsulates the network-layer packet data into frames, transmits the frames upon the network transmission medium, and deactivates the link when the data transfer is complete. In a receive mode, the network interface unit receives frames from the network transmission medium, checks the received frame data for error, and reassembles the packets from the frame data. All of the above actions are performed according to a selected communication protocol.

There are numerous communication protocols currently being used in LANs and WANs to effectuate communication among computer systems. Such protocols include TCP/IP, Ethernet, frame relay, DDS, ATM, X.25 and Sonet. Each communication protocol achieves data transmission in a different way, and network hardware and/or software designed to implement one communication protocol will typically not recognize data transmitted using another protocol. In addition, new communication protocols are continuously being developed in an effort to increase the rates and reliabilities of data exchanges.

A microcontroller is an integrated circuit which incorporates a processor core along with one or more support circuits on the same monolithic semiconductor substrate (i.e., chip). The support circuits perform support functions such as communication functions and memory interface functions. Systems which employ microcontrollers are typically implemented using fewer separate semiconductor devices. Advantages of such systems include lower fabrication costs and higher reliabilities. Microcontrollers find applications in industrial and commercial products including control systems, computer terminals, hand-held communications devices (e.g., cellular telephones), network interface equipment, photocopier machines, facsimile machines, and hard disk drives.

Many different types of programmable logic devices (PLDs) exist today. PLDs are general-purpose digital components which are manufactured in an "unprogrammed" state, and are later "programmed" to implement a desired logical function. A PLD is typically programmed by a sequence of electrical pulses which configure one or more arrays of programmable switching elements within the PLD. Examples of different types of PLDs include programmable logic arrays (PLAs), programmable array logic devices (PALs), and field programmable gate arrays (FPGAs). PLAs and PALs have AND and OR arrays. The AND array performs logical AND operations upon input values, forming product terms. The OR array performs logical OR operations upon the product terms, forming output values.

The AND and OR arrays of PLAs include programmable switching elements, while only the AND arrays of PALs are programmable. PLAs and PALs implement combinational logic functions as a sum of the product terms (i.e., a sum of products) of input values. FPGAs are semi-custom logic devices including "islands" of programmable logic blocks called "logic cells" surrounded by an interconnection network which includes programmable switching elements. The logical functions performed by the logic cells are determined by programming, as are the interconnections formed between the logic cells. PLAs, PALs, and FPGAs may also include storage elements called flip-flops needed to implement sequential logic functions.

It would be beneficial to have a network interface unit which includes a microcontroller having programmable logic circuitry configurable to implement one of many possible communication protocols. For example, the desired network interface unit could be configured to assemble, transmit, and receive data units (i.e., frames) of one protocol, then later reconfigured to assemble, transmit, and receive data units of another protocol. Reconfiguration is a problem which must be solved in order to allow the network interface unit to be reconfigured to implement different communication protocols. Essentially, the desired reconfigurable network interface unit must be included within network cards of computer systems of a LAN as well as any router which links the LAN to another computer system via, for example, the public switched telephone network (PSTN).

SUMMARY OF THE INVENTION

The problems outlined above are in large part solved by a network interface unit including a microcontroller having multiple blocks of programmable logic that are variably configurable to perform selected functions. The network interface unit may be configured to assemble, transmit, and receive data units (i.e., frames) of one communication protocol, then later reconfigured to assemble, transmit, and receive frames of another protocol. The network interface unit includes a microcontroller, one or more memory devices coupled to the microcontroller, and an electrical interface unit. The one or more memory devices are configured to store data, specifically instructions and data used by the microcontroller.

The microcontroller includes several components formed upon a single monolithic semiconductor substrate, among them a chip select unit, a bus interface unit, an execution unit, and a core bus. The core bus includes multiple signal lines used to convey signals within the microcontroller. The chip select unit, the bus interface unit, and the execution unit are coupled to the core bus. The bus interface unit includes multiple data buffers used to transfer data between the microcontroller and the one or more memory devices. The chip select unit and the bus interface unit are coupled to the one or more memory devices, and work together to store data within and to retrieve data from the one or more memory devices. The execution unit includes a processor core and multiple configurable logic blocks (CLBs) coupled to the processor core. The processor core is configured to execute instructions, for example x86 instructions. Each of the multiple CLBs includes programmable logic which may be, for example, PLA circuitry, PAL circuitry, or FPGA circuitry. The programmable logic includes programmable switching elements such as, for example, EPROM elements, EEPROM elements, or SRAM elements. The multiple CLBs may be configured to implement a selected communication protocol used to transmit and receive data via the electrical interface unit and the network transmission medium.

The processor core and the multiple CLBs are coupled to an operand bus, a result bus, a control bus, and a test/program bus. The operand bus, the result bus, the control bus, and the test/program bus include multiple signal lines used to convey signals. The operand bus conveys operands (i.e., data) from the processor core to each of the multiple CLBs. The result bus conveys signals from each of the multiple CLBs to the processor core. The control bus conveys control signals between the processor core and the multiple CLBs. The test/program bus conveys testing signals used to assess proper operation of the plurality of configurable logic blocks. The test/program bus also conveys programming signals from the processor core to program one or more of the multiple CLBs.

The multiple CLBs are also selectively coupled to a CLB interconnect bus by corresponding configurable switch blocks. The CLB interconnect bus has a plurality of signal lines used to convey intermediate results between the multiple CLBs. Each configurable switch block contains programmable switching elements which are configured to connect the corresponding CLB to one or more signal lines of the CLB interconnect bus during a programming operation. The programmable switching elements may be, for example, EPROM elements, EEPROM elements, or SRAM elements.

During instruction execution, the processor core produces output signals. During the programming operation, the output signals include programming signals which configure the programmable logic within one or more of the multiple CLBs to perform selected functions. The programming signals also configure the programmable switching elements within the configurable switch blocks. Once programmed, each CLB performs the selected function in response to output signals produced by the processor core. The CLBs preferably include constructs used to perform Joint Test Action Group (JTAG) boundary-scan testing of the CLBs. The boundary-scan testing constructs may be employed to configure the CLBs to perform the selected functions. The configurable switch blocks also preferably include JTAG boundary-scan testing constructs to facilitate configuration.

The electrical interface unit is coupled to the microcontroller and adapted for coupling to the network transmission medium. The electrical interface unit is configured to receive signals from the microcontroller and to drive the signals onto the network transmission medium. The electrical interface unit is also configured to receive signals from the network transmission medium and provide the signals to the microcontroller. The electrical interface unit preferably includes an isolation transformer for isolating signals within the network interface unit from signals present upon the network transmission medium.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 1:
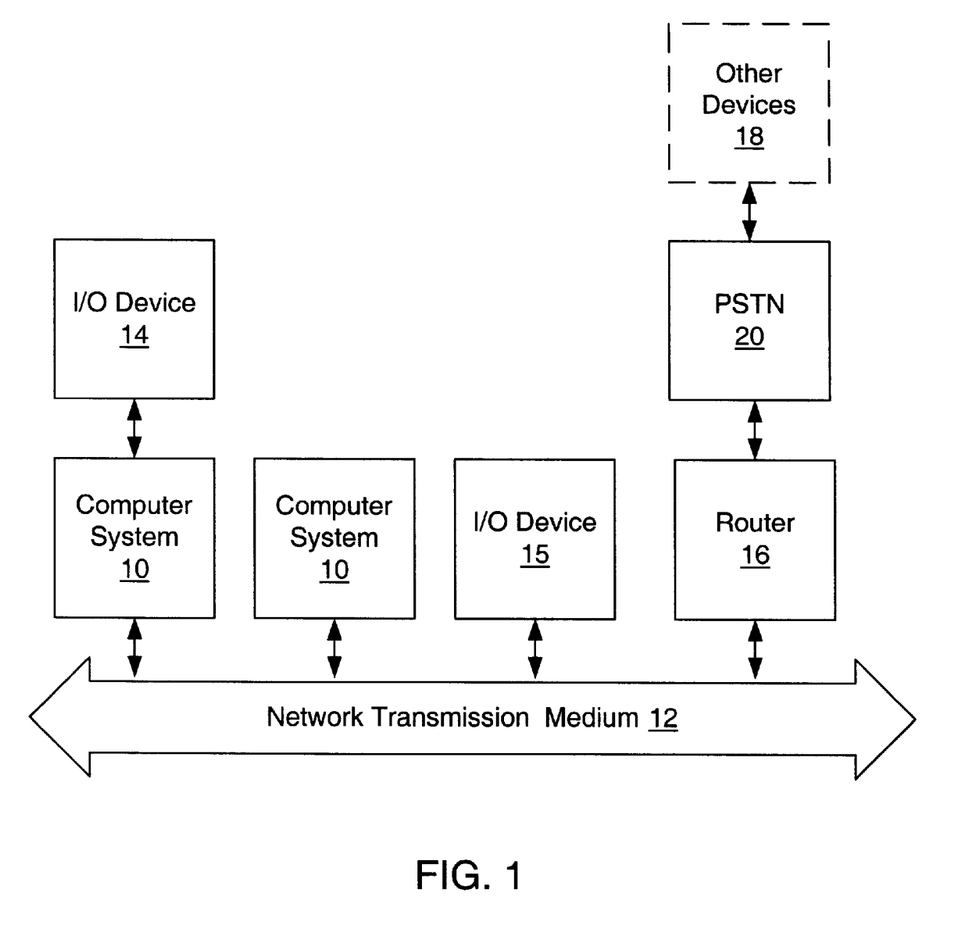
FIG. 1 is a block diagram of a communication system which incorporates the preferred embodiments of the present invention, wherein the communication system includes multiple computer systems coupled to a network transmission medium.

Referring now to FIG. 1, a communication system which incorporates the preferred embodiments of the present invention is shown. Several devices are coupled to a network transmission medium 12, including multiple computer systems 10, an input/output (I/O) device 15, and a router 16. Network transmission medium 12 interconnects the computer systems 10, I/O device 15, and router 16, forming a LAN. Network transmission medium 12 may be, for example, a coaxial cable, a twisted-pair cable, or a fiber-optic cable. I/O device 15 may be, for example, a printer. Each computer system 10 may be coupled to one or more I/O devices 14. I/O device 14 may be, for example, a facsimile (fax) machine. I/O devices 14 and 15 may be shared by the computer systems 10 via network transmission medium 12 (i.e., the LAN). Router 16 connects the computer systems 10 to other devices 18 through PSTN 20. Router 16 converts signals between the communication protocol used within the LAN and the WAN communication protocols used to communicate with the other devices 18 via PSTN 20. It is noted that router 16 is typically remote from the other devices 18.

Figure 2:
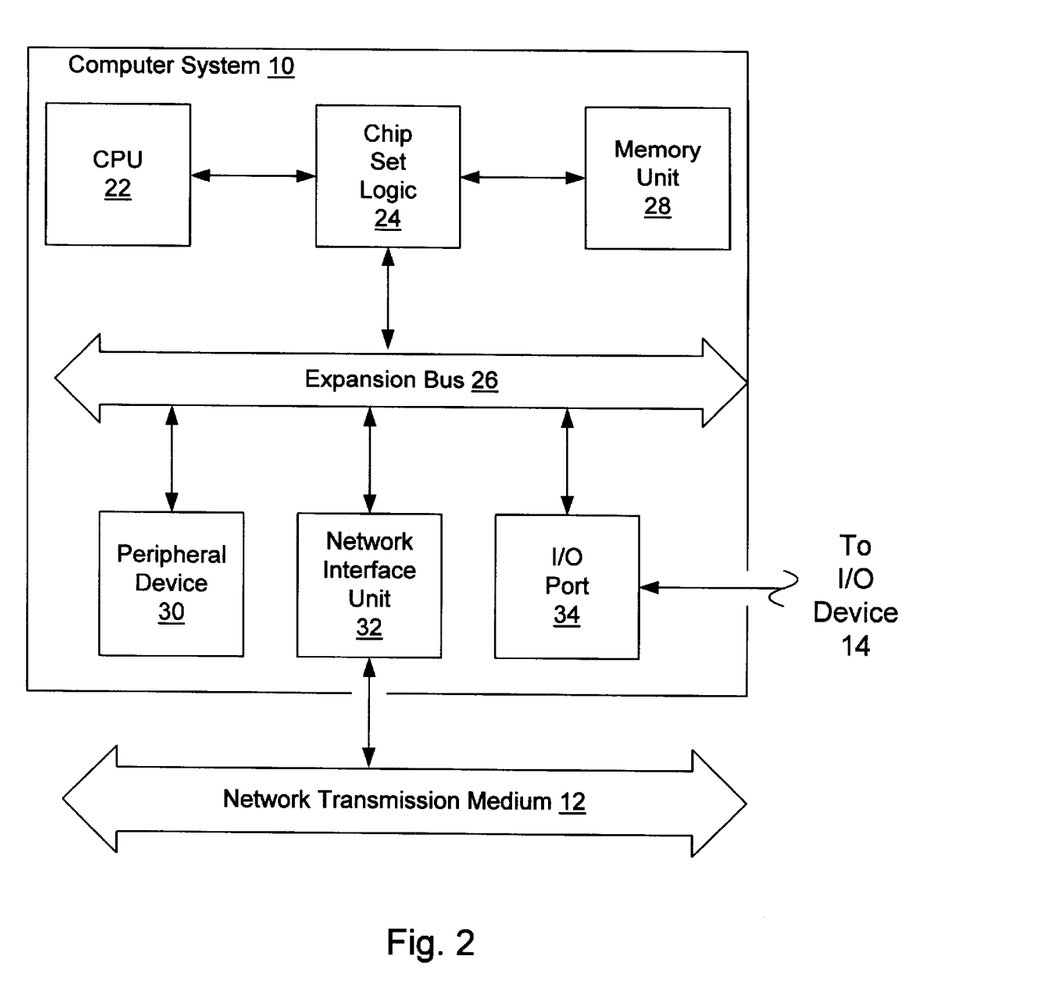
FIG. 2 is a block diagram of a preferred embodiment of each computer system of FIG. 1, wherein each computer system includes a network interface unit of the present invention.

FIG. 2 is a block diagram of a preferred embodiment of each computer system 10 of FIG. 1. Computer system 10 includes a central processing unit (CPU) 22 coupled to chip set logic 24. Chip set logic 24 is coupled to an expansion bus 26 and a memory unit 28. Memory unit 28 is configured to store data, and typically includes semiconductor memory devices. Chip set logic 24 functions as an interface between CPU 22 and expansion bus 26, and between CPU 22 and memory unit 28. Chip set logic 24 preferably includes a memory controller. CPU 22 obtains data (i.e., reads data) from memory unit 28 via chip set logic 24, and stores data (i.e., writes data) to memory unit 28 via chip set logic 24. Expansion bus 26 includes multiple signal lines, and is adapted for coupling to various peripheral devices. Accordingly, computer system 10 may include one or more peripheral devices 30 coupled to expansion bus 26. Peripheral device 30 may be, for example, a disk drive unit or a video display unit. Computer system 10 also includes one or more I/O ports 34 (e.g., serial data ports or parallel data ports). I/O device 14 is coupled to computer system 10 via I/O port 34.

Computer system 10 also includes a network interface unit 32 coupled to expansion bus 26. Network interface unit 32 is adapted for coupling to network transmission medium 12, and is configured to transmit and receive information (i.e., data) via network transmission medium 12. The sharing of I/O devices connected to the computer systems 10 (e.g., I/O device 14) is also effectuated by the exchange of data via network transmission medium 12. Network interface unit 32 operates in a transmit mode and a receive mode. In the transmit mode, network interface unit 32 receives data from expansion bus 26 and transmits the data upon transmission medium 12 according to a selected communication protocol. In the receive mode, the network interface unit 32 receives data from transmission medium 12 according to the selected communication protocol and drives signals corresponding to the data upon the signal lines of expansion bus 26.

Figure 3:
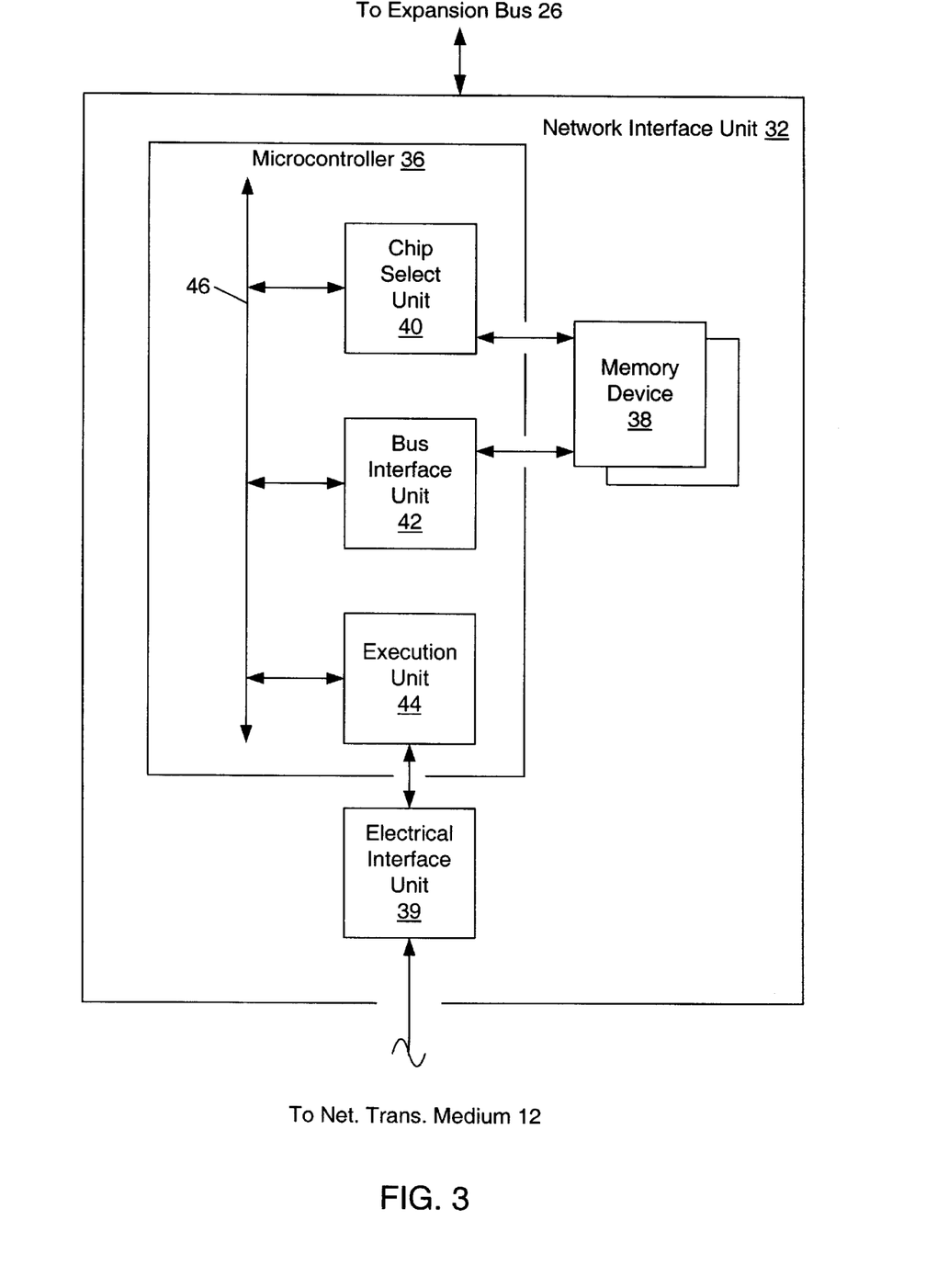
FIG. 3 is a block diagram of a preferred embodiment of the network interface unit of FIG. 2, wherein the network interface unit includes a microcontroller having an execution unit.

FIG. 3 is a block diagram of a preferred embodiment of network interface unit 32 of FIG. 2. Network interface unit 32 includes a microcontroller 36, one or more memory devices 38, and an electrical interface unit 39. The one or more memory devices 38 are coupled to microcontroller 36 and configured to store instructions and data used by microcontroller 36. The one or more memory devices 38 are preferably semiconductor memory devices such as, for example, static random access memory (SRAM) devices or dynamic random access memory (DRAM) devices.

Microcontroller 36 includes several components formed upon a single monolithic semiconductor substrate, among them a chip select unit 40, a bus interface unit 42, an execution unit 44, and a core bus 46. Core bus 46 is used to convey signals within microcontroller 36. Chip select unit 40, bus interface unit 42, and execution unit 44 are coupled to core bus 46. Chip select unit 40 and bus interface unit 42 are coupled to the one or more memory devices 38, and work together to store data within and to retrieve data from the one or more memory devices 38. Execution unit 44 includes circuitry to execute instructions. Execution unit 44 also includes circuitry to implement a selected communication protocol used to transmit and receive data via electrical interface unit 39 and network transmission medium 12.

Bus interface unit 42 is used to transfer data between microcontroller 36 and the one or more memory devices 38. During instruction execution, execution unit 44 generates output signals which represent an offset portion of an address of a memory location from which data is to be read or to which data is to be written. Execution unit 44 drives the address offset portion upon the core bus. Bus interface unit 42 receives the address offset portion via the core bus and combines the offset portion with a segment portion to produce an address signal. Bus interface unit 42 drives the address signal upon the core bus. Chip select unit 40 receives the address signal via the core bus and generates a chip select signal. The chip select signal is coupled to one or more memory devices 38 which include storage locations corresponding to the address signal. The chip select signal enables the one or more memory devices 38 for a data transfer operation.

Electrical interface unit 39 is coupled to microcontroller 36 and adapted for coupling to network transmission medium 12. Electrical interface unit 39 is configured to receive signals from microcontroller 36 and to drive the signals onto network transmission medium 12. Electrical interface unit 39 is also configured to receive signals from network transmission medium 12 and to provide the signals to microcontroller 36. Electrical interface unit 39 typically includes an isolation transformer for isolating signals within network interface unit 32 from signals present upon network transmission medium 12.

It is noted that each device operably coupled to network interface medium 12 in FIG. 1 includes at least one network interface unit 32. The multiple computer systems 10 and I/O device 15 include a single network interface unit 32 at the interface with network transmission medium 12. Router 16 may include two network interface units 32: one at the interface with network transmission medium 12, and the other at the interface with PSTN 20.

Figure 4:
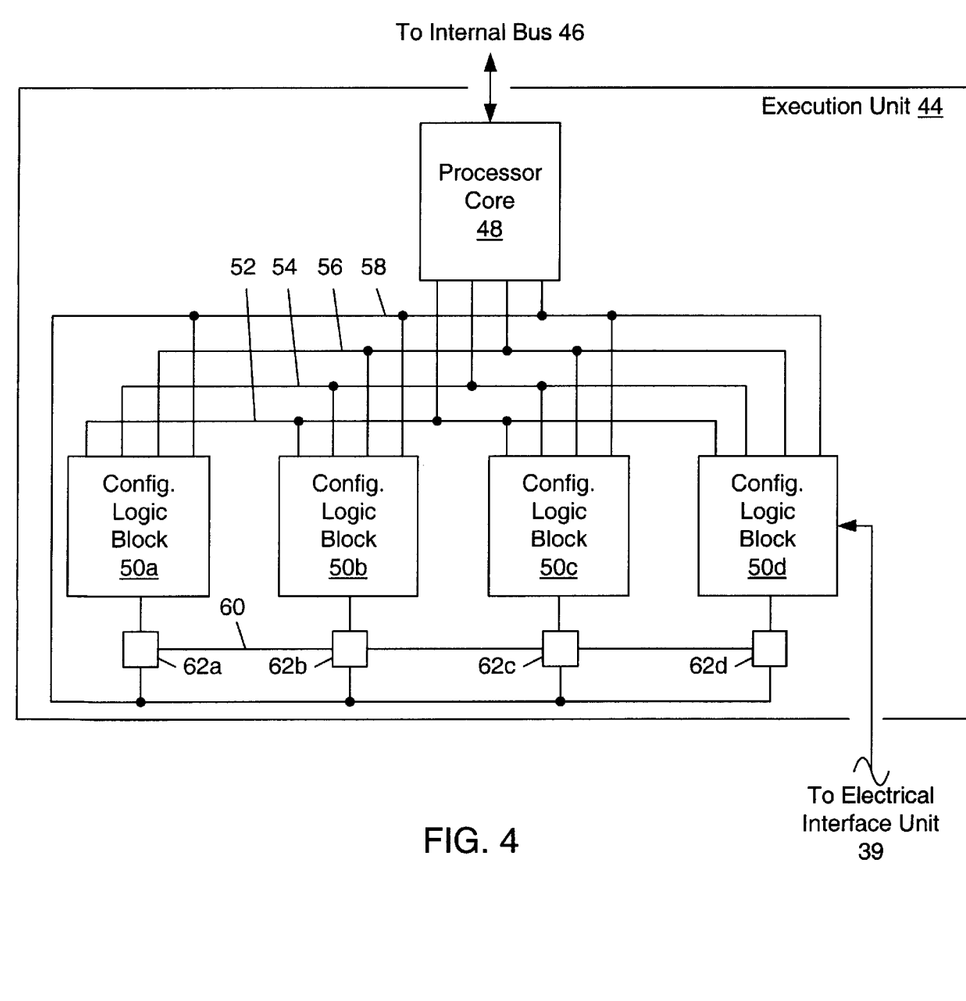
FIG. 4 is a block diagram of a preferred embodiment of the execution unit of the microcontroller of FIG. 3, wherein the execution unit includes a processor core coupled to multiple configurable logic blocks (CLBs) that are variably configurable to perform selected functions, and wherein the CLBs are selectively coupled to a CLB interconnect bus via corresponding configurable switch blocks.

FIG. 4 is a block diagram of a preferred embodiment of execution unit 44 of FIG. 3. Execution unit 44 includes a processor core 48 and multiple configurable logic blocks (CLBs) 50a–d. Processor core 48 and multiple CLBs 50a–d are formed upon the single monolithic semiconductor substrate of microcontroller 36. Processor core 48 is configured to execute instructions, for example x86 instructions. Each CLB 50 includes programmable logic which is configurable to perform a selected function in response to output signals produced by processor core 48 during instruction execution. Each CLB 50 may be configured to implement, for example, one or more functions required to transfer information using a selected communication protocol and via network transmission medium 12. Processor core 48 is coupled to each of the multiple CLBs 50a–d via an operand bus 52, a result bus 54, a control bus 56, and a test/program bus 58. Operand bus 52, result bus 54, control bus 56, and test/program bus 58 include multiple signal lines used to convey signals. Operand bus 52 is used by processor core 48 to provide data to the multiple CLBs 50a–d. Result bus 54 is used by the multiple CLBs 50a–d to provide computed results (i.e., data) to processor core 48. Control bus 56 is used to exchange control signals between processor core 48 and the multiple CLBs 50a–d. The exchange of control signals via control bus 56 allows processor core 48 to control the operations of the multiple CLBs 50a–d. Test/program bus 58 is used to perform testing of the multiple CLBs 50a–d and to configure the programmable logic within the multiple CLBs 50a–d. Processor core 48 performs a programming operation in order to configure the programmable logic within the multiple CLBs 50a–d.

Each of the multiple CLBs 50a–d is also coupled to one or more signal lines of a CLB interconnect bus 60 via corresponding configurable switch blocks 62a–d. CLB interconnect bus 60 is used to transfer data (i.e., intermediate results) between the multiple CLBs 50a–d. Each configurable switch block 62 is coupled to test/program bus 58. During the programming operation, test/program bus 58 is used to configure programmable switching elements within configurable switch blocks 62a–d, connecting each CLB 50 to one or more signal lines of CLB interconnect bus 60.

During instruction execution, processor core 48 produces output signals which are coupled to the multiple CLBs 50a–d. During the programming operation, the output signals configure the programmable logic within one or more of the multiple CLBs 50a–d to perform selected functions. Once programmed, each of the multiple CLBs 50a–d performs the selected function in response to output signals produced by processor core 48. It is noted that the set of instructions executed by processor core 48 may be extended to include instructions which cause processor core 48 to produce output signals for the purpose of testing and programming the multiple CLBs 50a–d. In addition, the set of instructions executed by processor core 48 may be extended to include instructions which require execution by one or more of the multiple CLBs 50a–d. In this case, processor core 48 in effect forwards the instruction on to the multiple CLBs 50a–d for execution. Processor core 48 produces output signals which induce one or more of the multiple CLBs 50a–d to perform their programmed functions in order to execute the instruction.

Figure 5:
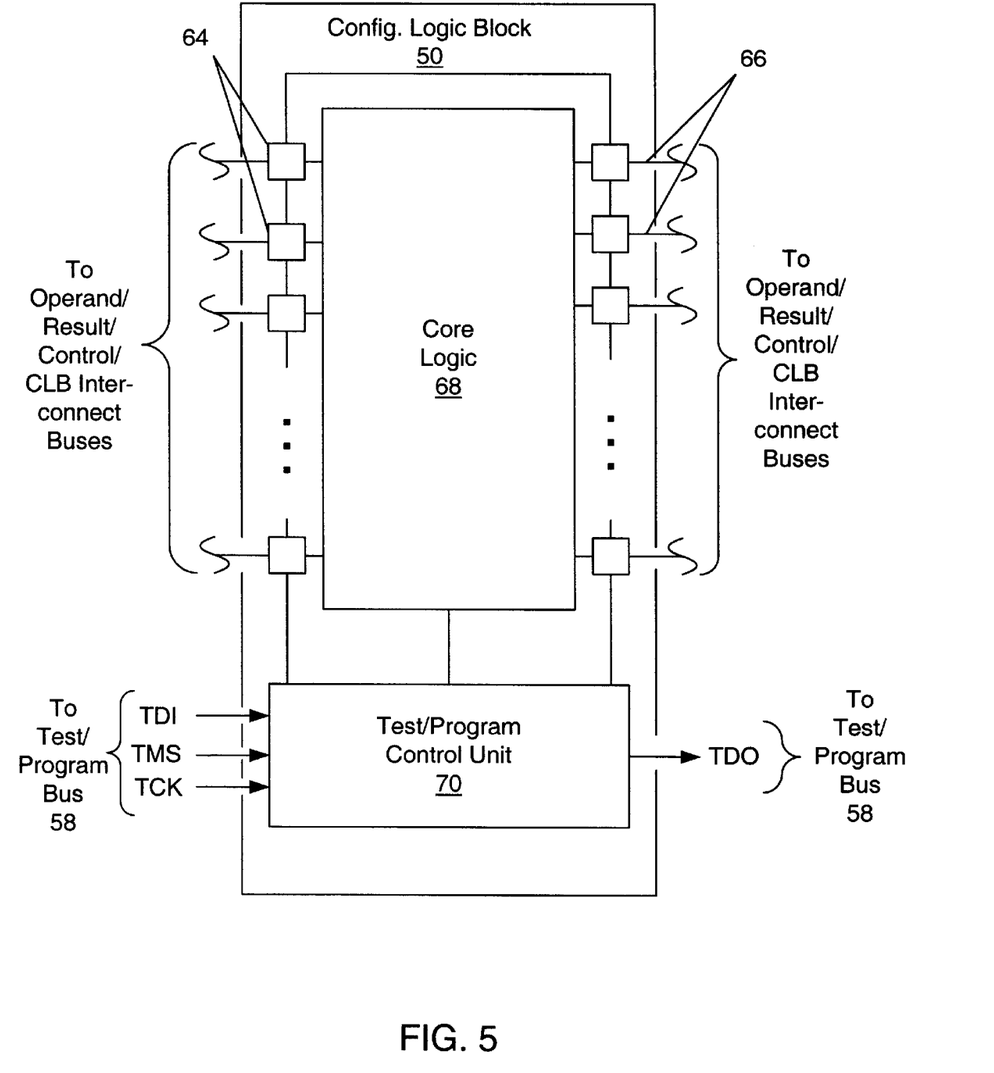
FIG. 5 is a block diagram of a preferred embodiment of each of the CLBs of FIG. 4, wherein constructs used to perform Joint Test Action Group (JTAG) boundary-scan testing of the CLBs are also employed to configure the CLBs to perform the selected functions.

FIG. 5 is a block diagram of a preferred embodiment of each CLB 50 of FIG. 4. CLB 50 is configured to facilitate Joint Test Action Group (JTAG) boundary-scan testing of internal circuitry according to IEEE Standard 1149.1–1990. In the embodiment of FIG. 4, constructs of the testing architecture are also used to configure the programmable logic within CLB 50 to perform, for example, one or more functions required to implement a selected communication protocol. CLB 50 includes multiple boundary scan cells 64 inserted between corresponding I/O signal lines 64 and a core logic 68. Boundary scan cells 64 are controlled by a test/program control unit 70. In an operational mode, signals upon I/O lines 66 flow to and from core logic 68 unimpeded. In a testing mode and a programming mode, test/program unit 70 configures boundary scan cells to form a serial "scan chain" surrounding core logic 68. Input values, produced by processor core 48 during instruction execution, are shifted through the scan chain, then applied to the core logic. In the testing mode, output values produced by core logic 68 are captured by a number of the boundary scan cells 64, shifted out through the scan chain, and compared to expected values. In the programming mode, the input signals applied to core logic 68 are used to configure programmable switching elements within core logic 68. As a result, core logic 68 is caused to implement a desired logic function.

One of several well known types of programmable logic circuitry may be used to form the core logic 68 of CLB 50, including those used to form PLDs. Examples of such programmable logic circuitry includes PLA circuitry, PAL circuitry, and FPGA circuitry. The programmable logic preferably includes storage elements (i.e., flip-flops) needed to implement sequential logic functions.

One of several well known types of programmable switching elements may be used within the core logic 68 of CLB 50, including erasable programmable read only memory (EPROM) elements, electrically erasable programmable read only memory (EEPROM) elements, and static random access memory (SRAM) elements. EPROM and EEPROM elements are floating-gate metal oxide semiconductor (MOS) transistors programmed by adding or removing charge from the floating gate. EEPROM elements are erased by adjacent electrical circuitry, while EPROM elements are erased by exposure to ultraviolet (UV) radiation. SRAM elements typically include multiple MOS transistors arranged to form a volatile memory cell.

Figure 6:
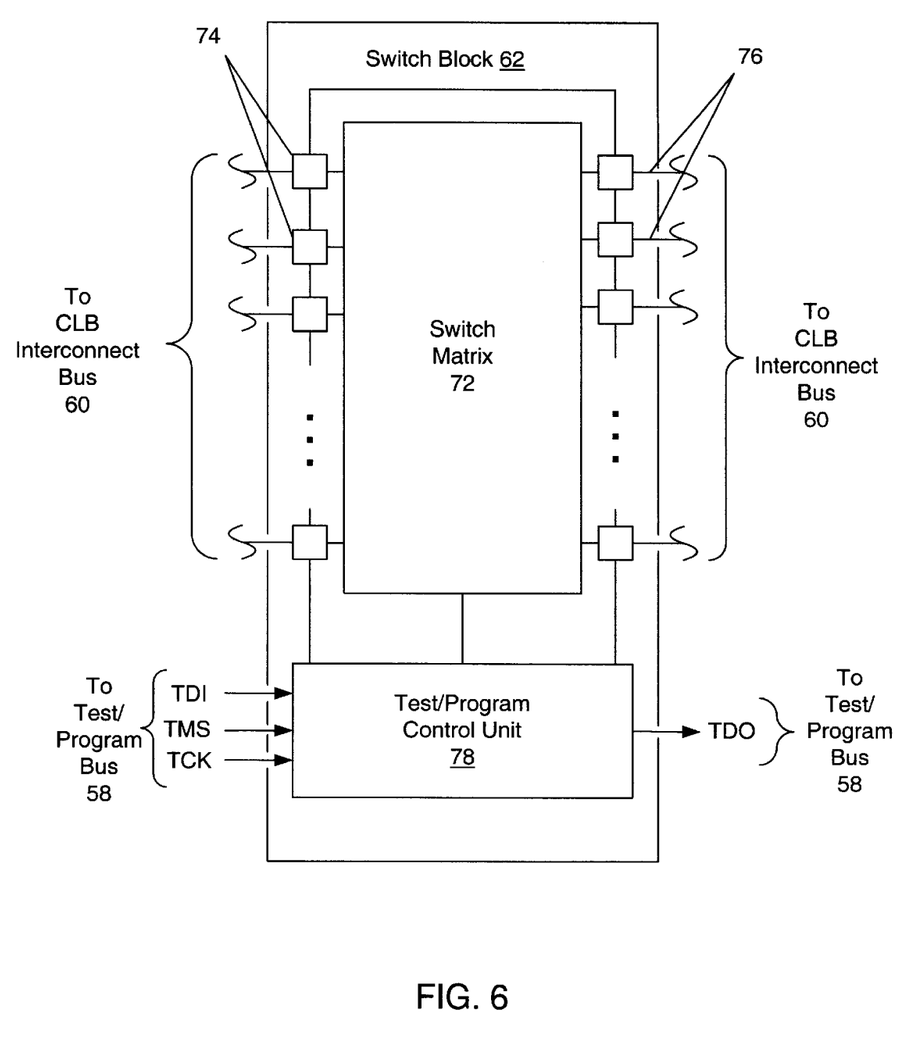
FIG. 6 is a block diagram of a preferred embodiment of each of the configurable switch blocks of FIG. 4, wherein JTAG boundary-scan testing constructs are employed to configure the configurable switch blocks.

FIG. 6 is a block diagram of a preferred embodiment of each configurable switch block 62 of FIG. 4. Switch block 62 employs the constructs of JTAG boundary-scan testing of internal circuitry according to IEEE Standard 1149.1–1990 in order to configure the programmable switching elements within a switch matrix 72. During the programming operation, the programmable switching elements within switch matrix 72 are configured to connect each CLB 50 to one or more signal lines of CLB interconnect bus 60. Switch block 62 includes multiple boundary scan cells 74 inserted between corresponding signal lines 76 of CLB interconnect bus 60 and switch matrix 72. Boundary scan cells 74 are controlled by a test/program control unit 78. In an operational mode and a testing mode, signals upon signal lines 76 of CLB interconnect bus 60 flow to and from switch matrix 72 unimpeded. In a programming mode, test/program unit 78 configures boundary scan cells 74 to form a serial scan chain surrounding switch matrix 72. Input values, produced by processor core 48 during instruction execution, are shifted through the scan chain, then applied to switch matrix 72 in order to configure the programmable switching elements within switch matrix 72. One of several well known types of programmable switching elements may be used within switch matrix 72, including, for example, EPROM elements, EEPROM elements, or SRAM elements.

The multiple CLBs 50*a–d* and the corresponding multiple switch blocks 62*a–d* are preferably connected in series to form a serial data scan path for testing and programming. Test/program bus 58 preferably includes four signal lines: test data input (TDI), test data output (TDO), test mode select (TMS), and test clock (TCK). The TDI signal line carries the input data for testing or programming the multiple CLBs 50*a–d*, and for programming the corresponding multiple switch blocks 62*a–d*. The TDO signal line carries the output data obtained form the core logic 68 of each of the multiple CLBs 50*a–d* during testing. The TMS signal line carries the control signal which determines the operating mode of test/program control units 70 and 78. The TCK signal synchronizes the operations of the test/program control units 70 and 78. The test/program control units 70 and 78 have three input signal lines: test data input (TDI), test mode select (TMS), and test clock (TCK). The test/program control units 70 and 78 have a single output signal line test data out (TDO). The TMS and TCK signal lines of test/program bus 58 are connected to the corresponding TMS and TCK inputs of the test/program control units 70 and 78. The TDI signal line of the test/program bus 58 is connected to the TDI input of a first test/program control unit 70 or 78. The TDO output of the first test/program control unit 70 or 78 is connected to the TDI input of a second test/program control unit 70 or 78. This process is continued until a last test/program control unit 70 or 78 is reached. The TDO output of the last test/program control unit 70 or 78 is connected to the TDO signal line of test/program bus 58. A serial data scan path is thus formed through the multiple CLBs 50*a–d* and the corresponding multiple switch blocks 62*a–d* for testing and programming. During testing of the multiple CLBs 50*a–d*, a bypass register within each of the test/program control units 78 of each switch block 62 is enabled, connecting the TDI input signal line to the TDO output signal line. The multiple switch blocks 62*a–d* are thus effectively bypassed during testing of the multiple CLBs 50*a–d*.

Processor core 48 configures the programmable switching elements within the multiple CLBs 50*a–d* and the corresponding multiple switch blocks 62*a–d* via signals driven upon test/program bus 58. Depending upon the type of programmable switching elements employed, processor core 48 may perform a programming operation automatically when electrical power to microcontroller 36 is restored following an interruption (i.e., during a "cold" system boot), or in response to software instructions.

Figure 7:
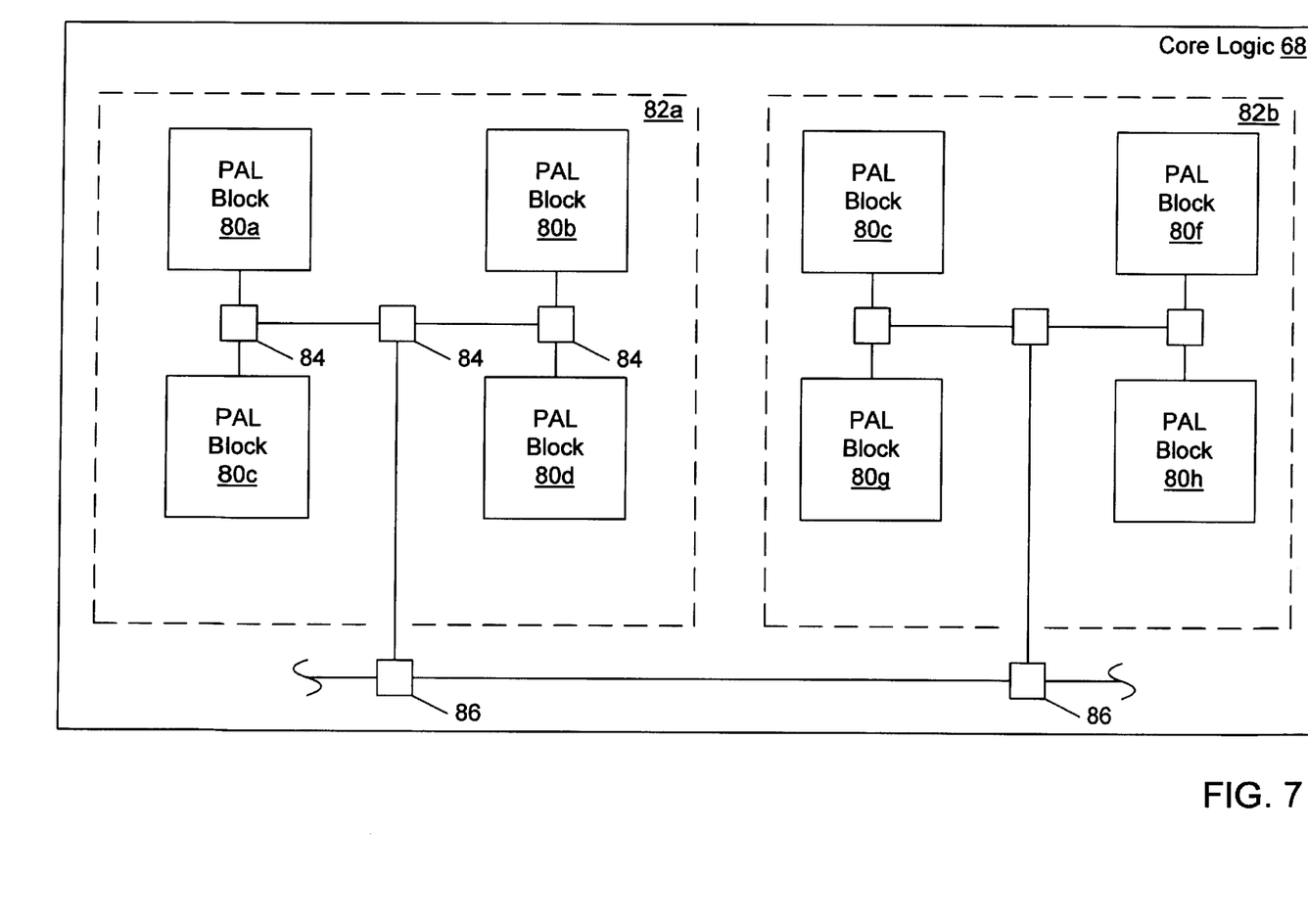
FIG. 7 is a block diagram of a preferred embodiment of a core logic of each CLB, wherein the core logic includes multiple PAL blocks surrounded by an interconnection network.

FIG. 7 is a block diagram of a preferred embodiment of the core logic 68 of each CLB 50. Core logic 68 includes multiple PAL blocks depicted by PAL blocks 80*a–h*. Each PAL block includes an AND array and an OR array as described above, and preferably includes one or more storage elements (i.e., flip-flops) needed to implement sequential logic functions. The multiple PAL blocks 80*a–h* are surrounded by an interconnection network which includes programmable switching elements. Sets of four adjacent PAL blocks are grouped together to form segments. Adjacent PAL blocks 80*a–d* form a first segment 82*a*, and adjacent PAL blocks 80*e–h* form a second segment 82*b*. PAL blocks in each segment are connected to the interconnection network through block interconnect switches. For example, PAL blocks 80*a–d* in first segment 82*a* are connected to the interconnect network through block interconnect switches 84. Segments are connected to the interconnect network through segment interconnect switches. For example, segments 82*a–b* are connected to the interconnect network through segment interconnect switches 86.

Figure 8:
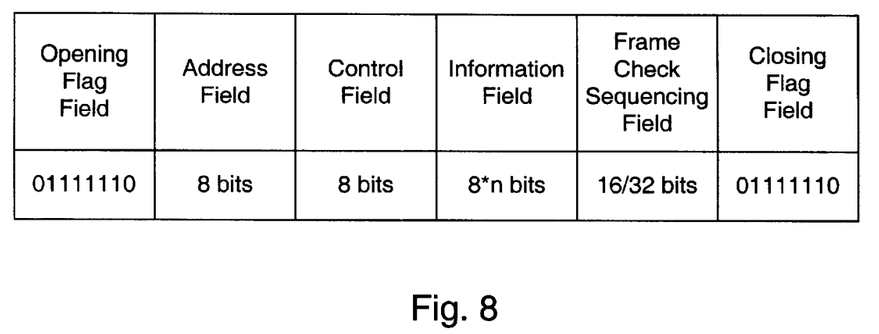
FIG. 8 illustrates the six fields of a frame of an HDLC communication protocol.

The following is a working example illustrating the configuration of execution unit 44 of microcontroller 36 (FIG. 4) to implement a transmit function using the high-level data link control (HDLC) communication protocol. The HDLC protocol is one of the most common ISO data link layer protocols. HDLC is a bit-oriented protocol which formats data and control information into frames, then transmits the frames over a data link. The control information includes error control information and flow control information. FIG. 8 illustrates the six fields of an HDLC frame: the opening flag field, the address field, the control field, the information field, the frame check sequencing (FCS) field, and the closing flag field. All HDLC frames begin and end with a flag sequence '01111110' duplicated in the opening and closing flag fields. The flag sequence is used for frame synchronization. The address field allows identification of the transmitting computer system (i.e., transmitter) and the receiving computer system (i.e., receiver) involved in the transmission. The control field contains the command, responses, and the sequence numbers used to maintain flow control between the transmitter and receiver. The information field contains data to be transmitted from the transmitter to the receiver. The FCS field contains a cyclic redundancy check (CRC) value calculated by the transmitter, allowing for error control. Upon receiving the frame, the receiver performs the same CRC calculation. If the CRC value calculated by the receiver does not match the value transmitted by the transmitter, the receiver indicates a transmission error by returning a frame having a command field containing a frame reject (FRMR) response. See, International Standard ISO/IEC 3309, "Information Technology—Telecommunications and Information Exchange Between Systems—High-Level Data Link Control (HDLC) Procedures—Frame Structure," 1993, ISO/IEC, available through the American National Standrds Institute, N.Y.

To implement the transmit function, each of the multiple CLBs 50*a–d* of execution unit 44 (FIG. 4) is assigned a specific task. CLB 50*a* receives a data stream from processor core 48, including the contents of the address field, control field, and information field data of a frame to be transmitted, via operand bus 52. CLB 50*a* performs a CRC generation function. CLB 50*a* generates a CRC value based upon the data in the data stream and appends the CRC value (i.e., the FCS field contents) to the end of the data stream. The data stream passes from CLB 50*a* to CLB 50*b* via configured CLB interconnect bus 60. CLB 50*b* performs a zero-bit insertion function upon the data stream. CLB 50*b* examines the data stream and inserts a '0' bit after all sequences of five continuous '1' bits in order to preclude the occurrence of the flag sequence '01111110' within the frame. The data stream passes from CLB 50*b* to CLB 50*c* via configured CLB interconnect bus 60. CLB 50*c* performs a flag and abort frame processing function. CLB 50*c* appends the flag sequence '01111110' to the beginning and to the end of the data stream, forming a complete frame. The data stream passes from CLB 50*c* to CLB 50*d* via configured CLB interconnect bus 60. Between frames, CLB 50*c* drives either the flag sequence, a continuous '1' bit, or a continuous '0' bit upon signal lines of CLB interconnect bus 60 connecting CLB 50*c* to CLB 50*d*. In response to a control signal from processor core 48, CLB 50*c* also drives an abort sequence upon the signal lines of CLB interconnect bus 60 connecting CLB 50*c* to CLB 50*d*. The abort sequence is a '0' bit followed by seven or 15 consecutive '1' bits. CLB 50*d* performs an output function. The frame data stream passes from CLB 50*d* to electrical interface unit 39 for transmission upon network transmission medium 12.

It will be appreciated to those skilled in the art having the benefit of this disclosure that this invention is believed to be capable of achieving a network interface unit including a reconfigurable microcontroller architecture. The microcontroller includes an execution unit having blocks of programmable logic that are variably configurable to perform selected functions. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A microcontroller formed upon a single monolithic semiconductor substrate, comprising:
    an execution unit, comprising:
        a processor core configured to execute instructions and to produce output signals during instruction execution;
        a plurality of configurable logic blocks coupled to receive the output signals;
        wherein during a programming operation the output signals comprise programming signals, and wherein the programming signals configure each of the configurable logic blocks to perform a selected function; and
        wherein following the programming operation each of the configurable logic blocks performs the selected function in response to the output signals;
    an operand bus having a plurality of signal lines, wherein the processor core and each of the plurality of configurable logic blocks are coupled to the operand bus, and wherein the operand bus conveys output signals from the processor core to each of the plurality of configurable logic blocks;
    a result bus having a plurality of signal lines, wherein the processor core and each of the plurality of configurable logic blocks are coupled to the result bus, and wherein the result bus conveys signals from each of the plurality of configurable logic blocks to the processor core;
    a control bus having a plurality of signal lines, wherein the processor core and each of the plurality of configurable logic blocks are coupled to the control bus, and wherein the control bus conveys control signals between the processor core and each of the plurality of configurable logic blocks; and
    a test/program bus having a plurality of signal lines, wherein the processor core and each of the plurality of configurable logic blocks are coupled to the test/program bus, and wherein the test/program bus conveys testing signals used to assess proper operation of the plurality of configurable logic blocks, and wherein the test/program bus also conveys the programming signals from the processor core to each of the plurality of configurable logic blocks.

2. The microcontroller as recited in claim 1, wherein the processor core is configured to execute instructions arising from an x86 instruction set.

3. The microcontroller as recited in claim 1, wherein each of the plurality of logic blocks includes a plurality of programmable switching elements.

4. The microcontroller as recited in claim 3, wherein the plurality of programmable switching elements comprises electrically erasable programmable read only memory (EEPROM) elements.

5. The microcontroller as recited in claim 1, further comprising:
    a configurable logic block (CLB) interconnect bus having a plurality of signal lines used to convey signals; and
    a plurality of configurable switch blocks, wherein each of the plurality of configurable switch blocks corresponds to one of the plurality of configurable logic blocks, and wherein each of the plurality of configurable switch blocks selectively couples the corresponding configurable logic block to the CLB interconnect bus.

6. The microcontroller as recited in claim 5, wherein each of the configurable switch blocks includes a plurality of programmable switching elements, and wherein each of the plurality of configurable switch blocks is coupled to the test/program bus, and wherein the test/program bus conveys the programming signals from the processor core to each of the plurality of configurable switch blocks, and wherein the programming signals configure each of the plurality of configurable switch blocks.

7. The microcontroller as recited in claim 1, further comprising:
    a bus interface unit coupled to the execution unit and configured to produce an address signal in response to output signals produced by the processor core of the execution unit; and
    a chip select unit coupled to receive the address signal and configured to produce a chip select signal in response to the address signal.

8. A microcontroller formed upon a single monolithic semiconductor substrate, comprising:
    a core bus having a plurality of signal lines for conveying signals;
    an execution unit coupled to the core bus, comprising:
        a processor core configured to execute instructions and to produce output signals during instruction execution;
        a plurality of configurable logic blocks coupled to receive the output signals;
        wherein during a programming operation the output signals comprise programming signals, and wherein the programming signals configure each of the configurable logic blocks to perform a selected function; and
        wherein following the programming operation each of the configurable logic blocks performs the selected function in response to the output signals;

a bus interface unit coupled to the core bus and configured to produce an address signal in response to output signals produced by the processor core of the execution unit; and a chip select unit coupled to the core bus and configured to produce a chip select signal in response to the address signal;

an operand bus having a plurality of signal lines, wherein the processor core and each of the plurality of configurable logic blocks are coupled to the operand bus, and wherein the operand bus conveys output signals from the processor core to each of the plurality of configurable logic blocks;

a result bus having a plurality of signal lines, wherein the processor core and each of the plurality of configurable logic blocks are coupled to the result bus, and wherein the result bus conveys signals from each of the plurality of configurable logic blocks to the processor core;

a control bus having a plurality of signal lines, wherein the processor core and each of the plurality of configurable logic blocks are coupled to the control bus, and wherein the control bus conveys control signals between the processor core and each of the plurality of configurable logic blocks;

a CLB interconnect bus having a plurality of signal lines used to convey signals;

a plurality of configurable switch blocks, wherein each of the plurality of configurable switch blocks corresponds to one of the plurality of configurable logic blocks, and wherein each of the plurality of configurable switch blocks selectively couples the corresponding configurable logic block to the CLB interconnect bus;

a test/program bus having a plurality of signal lines, wherein the processor core, each of the plurality of configurable logic blocks, and each of the plurality of configurable switch blocks are coupled to the test/program bus, and wherein the test/program bus conveys testing signals used to assess proper operation of the plurality of configurable logic blocks, and wherein the test/program bus also conveys the programming signals from the processor core to each of the plurality of configurable logic blocks and to each of the plurality of configurable switch blocks.

9. The microcontroller as recited in claim 8, wherein the processor core is configured to execute instructions arising from an x86 instruction set.

10. The microcontroller as recited in claim 8, wherein each of the plurality of logic blocks includes a plurality of programmable switching elements.

11. The microcontroller as recited in claim 10, wherein the plurality of programmable switching elements comprises electrically erasable programmable read only memory (EEPROM) elements.

12. The microcontroller as recited in claim 8, wherein each of the configurable switch blocks includes a plurality of programmable switching elements, and wherein the programming signals conveyed upon the test/program bus configure each of the plurality of configurable switch blocks.

13. A network interface unit for coupling a communication device to a network transmission medium, comprising:

a microcontroller having an execution unit comprising:

a processor core configured to execute instructions and to produce output signals during instruction execution; and a plurality of configurable logic blocks coupled receive the output signals;

wherein during a programming operation the output signals comprise programming signals, and wherein the programming signals configure each of the configurable logic blocks to perform a selected function; an wherein following the programming operation each of the configurable logic blocks performs the selected function in response to the output signals;

a memory device configured to store data and coupled to the microcontroller; and an electrical interface unit adapted for coupling to the network transmission medium, wherein the electrical interface unit is coupled to receive signals from the microcontroller and to drive the signals upon the network transmission medium;

an operand bus having a plurality of signal lines, wherein the processor core and each of the plurality of configurable logic blocks are coupled to the operand bus, and wherein the operand bus conveys output signals from the processor core to each of the plurality of configurable logic blocks;

a result bus having a plurality of signal lines, wherein the processor core and each of the plurality of configurable logic blocks are coupled to the result bus, and wherein the result bus conveys output signals from each of the plurality of configurable logic blocks to the processor core;

a control bus having a plurality of signal lines, wherein the processor core and each of the plurality of configurable logic blocks are coupled to the control bus, and wherein the control bus conveys control signals between the processor core and each of the plurality of configurable logic blocks; and a test/program bus having a plurality of signal lines, wherein the processor core and each of the plurality of configurable logic blocks are coupled to the test/program bus, and wherein the testprogram bus conveys testing signals used to assess proper operation of the plurality of configurable logic blocks, and wherein the test/program bus also conveys the programming signals from the processor core to each of the plurality of configurable logic blocks.

14. The network interface unit as recited in claim 13, wherein the processor core is configured to execute instructions arising from an x86 instruction set.

15. The network interface unit as recited in claim 13, wherein each of the plurality of logic blocks includes a plurality of programmable switching elements.

16. The network interface unit as recited in claim 15, wherein the plurality of programmable switching elements comprises electrically erasable programmable read only memory (EEPROM) elements.

17. The network interface unit as recited in claim 13, wherein the microcontroller further comprises:

a configurable logic block (CLB) interconnect bus having a plurality of signal lines used to convey signals; and a plurality of configurable switch blocks, wherein each of the plurality of configurable switch blocks corresponds to one of the plurality of configurable logic blocks, and wherein each of the plurality of configurable switch blocks selectively couples the corresponding configurable logic block to the CLB interconnect bus.

18. A microcontroller formed upon a single monolithic semiconductor substrate, comprising:

an execution unit, comprising:

a processor core configured to execute instructions and to produce output signals during instruction execution;

a plurality of configurable logic blocks coupled to receive the output signals;

an interconnect bus having a plurality of signal lines used to convey signals;

a plurality of configurable switch blocks, wherein each of the configurable switch blocks is coupled between a corresponding one of the configurable logic blocks and the interconnect bus, and wherein each of the configurable switch blocks is coupled to receive the output signals;

wherein during a programming operation the output signals comprise programming signals, and wherein the programming signals: (I) configure each of the configurable logic blocks to perform a selected function, and (ii) configure each of the configurable switch blocks to couple the corresponding configurable logic block to at least one of the signal lines of the interconnect bus; and wherein following the programming operation each of the configurable logic blocks performs the selected function in response to the output signals;

an operand bus having a plurality of signal lines, wherein the processor core and each of the plurality of configurable logic blocks are coupled to the operand bus, and wherein the operand bus conveys output signals from the processor core to each of the plurality of configurable logic blocks;

a result bus having a plurality of signal lines, wherein the processor core and each of the plurality of configurable logic blocks are coupled to the result bus, and wherein the result bus conveys signals from each of the plurality of configurable logic blocks to the processor core;

a control bus having a plurality of signal lines, wherein the processor core and each of the plurality of configurable logic blocks are coupled to the control bus, and wherein the control bus conveys control signals between the processor core and each of the plurality of configurable logic blocks;

a test/program bus having a plurality of signal lines, wherein the processor core, each of the plurality of configurable logic blocks, and each of the plurality of configurable switch blocks are coupled to the test/program bus, and wherein the test/program bus conveys testing signals used to assess proper operation of the plurality of configurable logic blocks, and wherein the test/program bus also conveys the programming signals from the processor core to each of the plurality of configurable logic blocks and to each of the plurality of configurable switch blocks.

\* \* \* \* \*

UNITED STATES PATENT AND TRADEMARK OFFICE
CERTIFICATE OF CORRECTION

PATENT NO. : 6,237,054 B1
DATED : May 22, 2001
INVENTOR(S) : Freitag, Jr.

Page 1 of 1

It is certified that error appears in the above-identified patent and that said Letters Patent is hereby corrected as shown below:

Claim 13, column 14,
Line 5, please delete the word "an" and substitute therefor -- and --.

Claim 18, column 15,
Line 13, after the phrase "the programming signals:" please delete "(I)" and subsitute therefor -- (i) --.

Signed and Sealed this

Thirtieth Day of October, 2001

Attest:

*Attesting Officer*

NICHOLAS P. GODICI
*Acting Director of the United States Patent and Trademark Office*